US010651323B2

(12) United States Patent
Gessert

(10) Patent No.: US 10,651,323 B2
(45) Date of Patent: May 12, 2020

(54) DEVICES AND METHODS FEATURING THE ADDITION OF REFRACTORY METALS TO CONTACT INTERFACE LAYERS

(71) Applicant: Alliance for Sustainable Energy, LLC, Golden, CO (US)

(72) Inventor: Timothy A. Gessert, Conifer, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 16/106,571

(22) Filed: Aug. 21, 2018

(65) Prior Publication Data

US 2018/0358487 A1 Dec. 13, 2018

Related U.S. Application Data

(62) Division of application No. 14/443,251, filed as application No. PCT/US2013/043250 on May 30, 2013, now abandoned.
(Continued)

(51) Int. Cl.
| H01L 31/0224 | (2006.01) |
| H01L 31/0392 | (2006.01) |
| H01L 31/18 | (2006.01) |
| H01J 37/34 | (2006.01) |
| H01L 21/02 | (2006.01) |
| H01L 31/0296 | (2006.01) |

(52) U.S. Cl.
CPC .. *H01L 31/022441* (2013.01); *H01J 37/3429* (2013.01); *H01L 31/022425* (2013.01); *H01L 31/022466* (2013.01); *H01L 31/03925* (2013.01); *H01L 31/1828* (2013.01); *H01L 21/02562* (2013.01); *H01L 31/02963* (2013.01); *Y02E 10/50* (2013.01)

(58) Field of Classification Search
CPC .......... H01L 31/0272; H01L 31/02725; H01L 31/02963; H01L 31/03925; H01L 31/073; H01L 31/0296; H01L 31/022466; H01L 31/1828; H01L 21/02562
USPC .................................................. 136/243-265
See application file for complete search history.

(56) References Cited

U.S. PATENT DOCUMENTS

| 4,338,482 A | 7/1982 | Gordon |
| 4,395,467 A | 7/1983 | Vossen, Jr. et al. |
(Continued)

FOREIGN PATENT DOCUMENTS

| CN | 101037795 | 9/2007 |
| WO | WO 2008/088551 A1 | 7/2007 |
(Continued)

OTHER PUBLICATIONS

Bradley, D., "Metal Alkoxides as Precursors for Electronic and Ceramic Materials", Chemical Review, vol. 89, Issue 6, Sep. 1, 1989, pp. 1317-1322.
(Continued)

*Primary Examiner* — Andrew J Golden
(74) *Attorney, Agent, or Firm* — Alexandra M. Hall

(57) ABSTRACT

Disclosed embodiments include CdS/CdTe PV devices (100) having a back contact (110,112) with oxygen gettering capacity. Also disclosed are back contact structures (110, 112) and methods of forming a back contact in a CdS/CdTe PV device (100). The described contacts and methods feature a contact having a contact interface layer (100) comprising a contact interface material, a p-type dopant and a gettering metal.

11 Claims, 3 Drawing Sheets

Related U.S. Application Data

(60) Provisional application No. 61/728,001, filed on Nov. 19, 2012.

(56) References Cited

U.S. PATENT DOCUMENTS

| | | | |
|---|---|---|---|
| 5,248,884 | A | 9/1993 | Brewitt-Taylor et al. |
| 5,348,594 | A | 9/1994 | Hanamura et al. |
| 5,909,623 | A | 6/1999 | Saihara |
| 5,909,632 | A | 6/1999 | Gessert |
| 5,922,142 | A | 7/1999 | Wu et al. |
| 6,042,752 | A | 3/2000 | Mitsui |
| 6,137,048 | A | 10/2000 | Wu et al. |
| 6,169,246 | B1 | 1/2001 | Wu et al. |
| 6,180,870 | B1 | 1/2001 | Sano et al. |
| 6,221,495 | B1 | 4/2001 | Wu et al. |
| 6,246,071 | B1 | 6/2001 | Qadri et al. |
| 6,281,035 | B1 | 8/2001 | Gessert |
| 6,569,548 | B2 | 5/2003 | Yamamoto et al. |
| 6,606,333 | B2 | 8/2003 | Kadota |
| 6,677,063 | B2 | 1/2004 | Finley |
| 6,685,623 | B2 | 2/2004 | Presthus et al. |
| 6,733,895 | B2 | 5/2004 | Kadota et al. |
| 6,787,253 | B2 | 9/2004 | Iwabuchi et al. |
| 6,852,623 | B2 | 2/2005 | Park et al. |
| 6,908,782 | B2 | 6/2005 | Yan et al. |
| 6,936,761 | B2 | 8/2005 | Pichler |
| 7,071,121 | B2 | 7/2006 | Punsalan et al. |
| 7,186,465 | B2 | 3/2007 | Bright |
| 7,699,965 | B2 | 4/2010 | Ikisawa et al. |
| 7,727,910 | B2 | 6/2010 | Ahn et al. |
| 8,084,682 | B2 | 12/2011 | Chen |
| 8,253,012 | B2 | 8/2012 | Gessert et al. |
| 8,734,621 | B2 | 5/2014 | Gessert et al. |
| 8,747,630 | B2 | 6/2014 | Gessert et al. |
| 2001/0013361 | A1 | 8/2001 | Fujisawa et al. |
| 2002/0036286 | A1 | 3/2002 | Ho et al. |
| 2003/0121468 | A1 | 7/2003 | Boone et al. |
| 2003/0207093 | A1 | 11/2003 | Tsuji et al. |
| 2003/0218153 | A1 | 11/2003 | Abe |
| 2004/0081836 | A1 | 4/2004 | Inoue et al. |
| 2005/0062134 | A1 | 3/2005 | Ho et al. |
| 2005/0276987 | A1 | 12/2005 | Fujisawa et al. |
| 2006/0118406 | A1 | 6/2006 | Delahoy et al. |
| 2006/0289091 | A1 | 12/2006 | Buonassisi et al. |
| 2007/0000537 | A1 | 1/2007 | Leidholm |
| 2007/0007125 | A1 | 1/2007 | Krasnov et al. |
| 2007/0116986 | A1 | 5/2007 | Garg et al. |
| 2008/0118777 | A1 | 5/2008 | Li et al. |
| 2008/0296569 | A1 | 12/2008 | Ho et al. |
| 2009/0053511 | A1 | 2/2009 | Kim et al. |
| 2009/0162560 | A1 | 6/2009 | DeLuca et al. |
| 2009/0194165 | A1 | 8/2009 | Murphy et al. |
| 2009/0197757 | A1 | 8/2009 | Fukushima |
| 2009/0242029 | A1 | 10/2009 | Paulson et al. |
| 2009/0297886 | A1 | 12/2009 | Gessert et al. |
| 2010/0024876 | A1 | 2/2010 | McClary et al. |
| 2010/0059112 | A1 | 3/2010 | Gupta et al. |
| 2010/0108503 | A1 | 5/2010 | Bartholomeusz et al. |
| 2010/0171082 | A1 | 7/2010 | Gessert et al. |
| 2010/0203364 | A1 | 8/2010 | Fortmann |
| 2010/0206372 | A1 | 8/2010 | Buller et al. |
| 2010/0233836 | A1 | 9/2010 | Kyotani et al. |
| 2010/0243039 | A1 | 9/2010 | Korevaar |
| 2011/0005591 | A1 | 1/2011 | Buller et al. |
| 2011/0011460 | A1 | 1/2011 | Munteanu et al. |
| 2011/0041917 | A1 | 2/2011 | Dauson et al. |
| 2011/0061737 | A1 | 3/2011 | Hotz et al. |
| 2011/0084239 | A1 | 4/2011 | Gessert et al. |
| 2011/0094416 | A1 | 4/2011 | Kawai et al. |
| 2011/0108099 | A1 | 5/2011 | Pinarbasi et al. |
| 2011/0121378 | A1 | 5/2011 | Ahn et al. |
| 2011/0197958 | A1 | 8/2011 | Li et al. |
| 2011/0240123 | A1 | 10/2011 | Lin et al. |
| 2011/0259418 | A1 | 10/2011 | Hollars |
| 2011/0312120 | A1 | 12/2011 | Weiner et al. |
| 2011/0315220 | A1 | 12/2011 | Korevaar |
| 2012/0031492 | A1 | 2/2012 | Sevvana et al. |
| 2012/0043215 | A1 | 2/2012 | Basol |
| 2012/0097222 | A1 | 4/2012 | Gessert et al. |
| 2012/0107491 | A1 | 5/2012 | Li et al. |
| 2012/0192948 | A1 | 8/2012 | Basol |
| 2012/0305064 | A1 | 12/2012 | Johnson et al. |
| 2013/0213478 | A1 | 8/2013 | Munteanu et al. |
| 2015/0047669 | A1 | 2/2015 | Barnes et al. |

FOREIGN PATENT DOCUMENTS

| | | |
|---|---|---|
| WO | WO 2009/116990 A1 | 9/2009 |
| WO | WO 2009/117072 A1 | 9/2009 |
| WO | WO 2011/049933 A1 | 4/2011 |
| WO | WO 2011/075579 A1 | 6/2011 |
| WO | WO 2011/126709 A2 | 10/2011 |
| WO | WO 2011/149982 A2 | 12/2011 |
| WO | WO 2013/119550 A1 | 8/2013 |
| WO | WO 2013/173633 A1 | 11/2013 |
| WO | WO 2014/077895 A1 | 5/2014 |

OTHER PUBLICATIONS

Burst, J., "RF-Sputtered ITO and ITO:Zr Studied by in SITU Spectroscopic Ellipsometry", presented at the 2010 35th IEEE Photovoltaic Specialists Conference (PVSC) held Jun. 20-25, 2010 in Honolulu, Hawaii, pp. 2408-2412.

Burst, J., et al., "Recent Developments in Transparent Conducting Oxides for Thin-Film Solar Cells", Abstract, AVS 57th International Symposium & Exhibition held Oct. 17-22, 2010 in Albuquerque, New Mexico.

Calnan, S. et al., "High mobility transparent conducting oxides for thin film solar cells", Thin Solid Films, vol. 518, Issue 7, Jan. 31, 2010, pp. 1839-1849.

Chen, T.H., et al., "Effects of metal-doped indium-tin-oxide buffer layers in organic light-emitting devices", Journal of Applied Physics, vol. 99, Issue 11, Jun. 1, 2006, pp. 114515-1-114515-6.

Chopra, K. et al., "Transparent Conductors—A Status Review," Thin Solid Films, vol. 102, Issue 1, Apr. 1983, pp. 1-46.

Coburn, J., et al., "A Study of the Neutral Species rf Sputtered form Oxide Targets", Japan Journal of Applied Physics, Suppl. 2, Pt. 1, 1974, pp. 501-504.

Coutts, T., et al., "Characterization of Transparent Conducting Oxides", MRS. Bulletin, vol. 25, Aug. 2000, pp. 58-65.

Exharhos, G., et al., "Discovery-based design of transparent conducting oxide films", Thin Solid Films, vol. 515, Issue 18, Jun. 25, 2007, pp. 7025-7052.

Frank, G. et al., "Electrical Properties and Defect Model of Tin-Doped Indium Oxide Layers," Applied Physics A, vol. 27, Issue 4, Apr. 1982, pp. 197-206.

Gessert, T. et al., "Summary Abstract: The dependence of the electrical properties of ion-beam sputtered indium tin oxide on its composition and structure," J. Vac. Sci. Technol. A. vol. 5, No. 4, Jul./Aug. 1987, pp. 1314-13-15.

Gessert, T., et al., "Studies of ZnTe Back Contacts to CdS/CdTe Solar Cells", presented at the Proceedings of 26th IEEE Photovoltaic Specialists Conference, Sep. 30-Oct. 3, 1997, pp. 419-422, Anaheim, California.

Gessert, T., et al., "Study of ZnTe:Cu/Metal Interfaces in CdS/CdTe Photovoltaic Solar Cells", presented at the Fall MRS Meeting, Dec. 1-5, 2003, Boston Massachusetts, Material Research Society Proceedings vol. 796, 2004, pp. 79-84.

Gessert, et al., "Evolution of DcS/CdTe Device Performance During Cu Diffusion", Proc. 31th IEEE PV Specialists Conference, IEEE, Piscataway, New Jersey, 2005, pp. 291-294.

Gessert, et al., "Formation of AnTe:Cu/Ti Contacts at High Temperature for CdS/CdTe Devices", Proc. 4th WCPVEC, IEEE, Piscataway, New Jersey, 2006, pp. 432-435.

Gessert, T., et al., "Analysis of CdS/CdTe Devices Incorporating a ZnTe:Cu Contact", Thin Film Solid Films, vol. 515, Issue 15, May 31, 2007, pp. 6103-6106.

(56) References Cited

OTHER PUBLICATIONS

Gessert, T., et al., "High-Transparency Sputtered In2O3 and ITO Films Containing Zirconium," presented at the AVS 54th International Symposium & Exhibition held Oct. 14-17, 2007 in Seattle, Washington.
Gessert, T., "Progress and Roadmap Alignment Company or Organization: National Center for Photovoltaics [sic] Funding Opportunity: EE&RE," presented at the Solar Energy Technologies Program (SETP) Annual Program Review Meeting held Aug. 22-24, 2008 in Austin Texas.
Gessert, et al., "Dependence of Carrier Lifetime on Cu-Contacting Temperature and ZnTe:Cu Thickness in CdS/CdTe Thin Film Solar Cells", Thin Solid Films vol. 517, Issue 7, Feb. 2, 2009, pp. 2370-2373.
Gessert, T., et al., "Advantages of transparent conducting oxide thin films with controlled permittivity for thin film photovoltaic solar cells", Thin Solid Films, vol. 519, Issue 21, Aug. 31, 2011, pp. 7146-7148.
Groth, R., "A study of semiconducting indium oxide films", Phys. Stat. Sol. 14, 69 (1966), pp. 69-75 (with full English translation).
Haacke, G., "Transparent Conducting Coatings", Annual Review of Materials Science, vol. 7, Aug. 1997, pp. 73-93.
Kaminska, E., et al., "Properties of p-Type ZnO Grown by Oxidation of Zn-Group-V Compounds", Material Research Society Symposium Proceedings, vol. 957, Fall 2006, pp. 121-126.
Kanai, Y., "Electrical Properties of In2O3 Singe Crystals Doped with Metallic Donor Impurity," Japan Journal of Applied Physics, vol. 23, No. 1, Jan. 1984, p. 127.
Li, G.F., et al., "Organic light-emitting device with surface-modified tungsten-doped indium oxide anode", Electronics Letters, vol. 44, No. 13, Jun. 19, 2008, 2 pages.
Meng, Y., et al., "Molybdenum-doped indium oxide transparent conductive thin films", Journal of Vacuum Science & Technology A, vol. 20, No. 1, Jan./Feb. 2002, pp. 288-290.
Mills, K.C., Thermodynamic Data for Inorganic Sulphides, Selenides and Tellurides (Butterworths, London, 1974), p. 56.
Miyata, T., et al., "New transparent conducting thin films using multicomponent oxides composed of ZnO and V2O5 prepared by magnetron sputtering", Thin Solid Films, vol. 411, Issue 1, May 22, 2002, pp. 76-81.
Ohta, H., et al., "Highly electrically conductive indium-tin-oxide thin films epitaxially grown on yttria-stabilized zirconia (100) by pulsed-laser deposition," Applied Physics Letters, vol. 76, No. 19, May 8, 2000, pp. 2740-2742.
Ohta et al., "Surface morphology and crystal quality of low resistive indium tin oxide grown on yttria [sic]-stabilized zirconia," Journal of Applied Physics, vol. 91, No. 6, Mar. 15, 2002, pp. 3547-3550.
Streetman, "Solid State Electronic Devices", Second Edition, Prentice-Hall, Inc. Englewood Cliffs, New Jersey, 1980, pp. 136-140.
Sze, "Physics of Semiconductor Devices", John Wiley & Sons, New York, New York, 1918, pp. 74-77.
Tamura, K., et al., "Donor-acceptor pair luminescence in nitrogen-doped ZnO films grown on lattice-matched ScAlMgO4(0001) substrates", Solid State Communications, vol. 127, Issue 4, Jul. 2003, pp. 265-269.
Tompa, G., et al., "A comparative study of MOCVD produced ZnO films doped with N, As, P and Sb", Material Research Society Symposium Proceedings, vol. 957, Fall 2007, 283-287.
Transene Company, Inc.—"Palladium Etchant—Type TFP Titanium Etchant—Type TFT" Bulletin #223-224.
Wan, C., et al., "LPCVD of Tin Oxide From Tetramethyltin and Oxygen", Journal of Electrochemical Society, vol. 136, No. 5, May 1989, pp. 1459-1463.
Wang H., et al., "Growth of p-type ZnO thin films by (N, Ga) co-doping using DMHy dopant", Journal of Physics D: Applied Physics, vol. 40, No. 15, Aug. 7, 2007, pp. 4682-4685.
Wei, S. et al., "Chemical trends of defect formation and doping limit in II-VI semiconductors: The case of CdTe", Physical Review B, vol. 66, Issue 15, Oct. 15, 2002, pp. 155211-1-155211-10.
Yoshida, Y., et al., "Thin-Film Indium Oxide Doped with Refractory Metals," MRS Symp. Proc., vol. 747, pp. V1.4.1-V1.4.6, 2003.
International Search Report for PCT Patent Application No. PCT/US2013/024743 dated Apr. 4, 2013.
International Preliminary Report on Patentability for PCT Patent Application No. PCT/US2013/024743 dated Aug. 12, 2014.
International Search Report for PCT Patent Application No. PCT/US2013/043250 dated Nov. 1, 2013.
International Preliminary Report on Patentability for PCT Patent Application No. PCT/US2013/043250 dated May 19, 2015.
International Search Report for PCT Patent Application No. PCT/US2007/060553 dated Oct. 10, 2007.
International Preliminary Report on Patentability for PCT Patent Application No. PCT/US2007/060553 dated Jul. 30, 2009.
International Search Report for PCT Patent Application No. PCT/US2008/057244 dated Nov. 26, 2008.
International Preliminary Report on Patentability for PCT Patent Application No. PCT/US2008/057244 dated Sep. 21, 2010.
Written Opinion for PCT Patent Application No. PCT/US2013/024743 dated Apr. 4, 2013.
Written Opinion for PCT Patent Application No. PCT/US2013/043250 dated Nov. 1, 2013.
Written Opinion for PCT Patent Application No. PCT No. PCT/US2007/060553 dated Oct. 10, 2007.
Written Opinion for PCT Patent Application No. PCT/US2008/057244 dated Nov. 26, 2008.
International Search Report and Written Opinion for PCT Patent Application No. PCT/US2013/041431 dated Oct. 11, 2013.

DEVICES AND METHODS FEATURING THE ADDITION OF REFRACTORY METALS TO CONTACT INTERFACE LAYERS

PRIORITY

This application is a divisional application of U.S. Nonprovisional application Ser. No. 14/443,251, filed May 15, 2015, which is a 371 application of PCT Patent Application Number PCT/US0213/043250, filed May 30, 2013, which claims priority to, and the benefit of, U.S. Provisional Application No. 61/728,001 filed on Nov. 19, 2012 the content of which are hereby incorporated by reference in their entirety and for all purposes.

CONTRACTUAL ORIGIN

The United States Government has rights in this invention under Contract No. DE-AC36-08 GO28308 between the United States Department of Energy and the Alliance for Sustainable Energy, LLC, the manager and operator of the National Renewable Energy Laboratory.

BACKGROUND

Thin-film photovoltaic (PV) devices based on CdS/CdTe technology represent one of the fastest-growing segments of all PV technologies. Most CdS/CdTe devices are configured in one or more variations of a superstrate design. In a typical superstrate design, light enters the device through a transparent glass "superstrate," is transmitted through one or more transparent conducting oxide (TCO) layers, one or more buffer layers and through an n-type CdS and/or CdS-alloy window layer. The light is then absorbed in a CdTe absorber layer.

A superstrate configured CdS/CdTe device must also include an ohmic contact in electrical communication with the CdTe absorber layer opposite the CdS window. This contact is commonly referred to as the "back contact." A back contact is necessary to establish a low-resistance pathway for electrons to enter the CdTe layer during device operation. It is now known however, that certain back contact formation process will also significantly alter the electrical properties of the underlying CdTe layer, thereby significantly affecting device functionality. In particular, an as-deposited CdTe layer is often of insufficient electrical quality for effective junction operation. Many factors affect the suitability of a CdTe layer, including the CdTe source material used, the specifics of the CdTe deposition steps and selected treatment processes. Often, the net acceptor density of the CdTe layer will be too low for optimal device operation. Also, the CdTe material may be n-type prohibiting device operation. Even if the acceptor density is sufficiently high in the CdTe as deposited, the minority-carrier lifetime is often too short for efficient operation.

The foregoing problems can be addressed by back contacting processes that diffuse one or more dopant species into the CdTe layer. Although Cu has been historically for the active diffusing dopant species, other group IB species (for example Au or Ag) or group VA species (for example, N, P, As, Sb, or Bi) have been found to demonstrate potential for this use. Although the precise defect formation that occurs during dopant diffusion remains debated, it is known that a successful diffusion alters the electrical properties of the underlying CdTe layer so that it becomes sufficiently p-type to establish a strong field in the device regions near the n-type CdS layer. Furthermore, Cu diffusion at an appropriate temperature has been found to increase carrier lifetime within the CdTe layer.

One back contact structure which has been shown to be particularly advantageous includes a ZnTe contact interface layer doped with copper, referred to herein as a ZnTe:Cu contact interface layer. After deposition, some or all of the ZnTe:Cu contact interface layer is then overlaid with a deposited metal contact. As noted above, Cu must diffuse from the contact interface layer into the CdTe layer to improve CdS/CdTe device functionality by causing the CdTe layer to become p-type and possibly by changing other electrical properties of the CdTe layer. Thus, any process that prevents or limits Cu diffusion can be detrimental to the process reproducibility and ultimate device efficiency. For example, oxidation of Cu to form CuO during or after deposition of the contact interface layer can limit diffusion of any Cu contained within an oxide.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Some disclosed embodiments are methods of forming a back contact in a CdS/CdTe PV device. The methods include providing a sputter-deposition target made of at least a contact interface material, a p-type dopant and a gettering metal, depositing a contact interface layer from the target to a CdTe device layer and depositing an outer metallization layer to the contact interface layer. In some instances, the gettering metal in the target is provided as a non-oxide compound of the gettering metal that exhibits a smaller negative enthalpy than an oxide of the gettering metal. The gettering metal may be, but is not limited to one of Ti, Zr and Hf. For example, the gettering metal may be provided in the target as $TiTe_2$. The contact interface material in the target may be provided as ZnTe or another suitable contact interface material. The p-type dopant may be Cu or another suitable dopant.

Method embodiments may more specifically include providing a target powder, pressing the target powder into a deposition target in an inert or reducing atmosphere and machining the target in an inert or reducing atmosphere. The contact interface layer may also be deposited from the target in an inert or reducing atmosphere. These steps reduce the risk of prematurely oxidizing the gettering metal along with other advantages.

Alternative embodiments include a CdS/CdTe PV device comprising a superstrate; one or more TCO layers in physical contact with the superstrate; an n-type CdS layer in electrical contact with at least one TCO layer; a CdTe layer in electrical contact with the CdS layer; a process that includes $CdCl_2$ or other suitable material to improve the quality of the CdTe layer and/or electrical junction; a process to remove residues remaining from the $CdCl_2$ processing; a contact interface layer comprising a contact interface material, a dopant and a gettering metal in electrical contact with the CdTe layer; and an outer metallization layer in electrical contact with the contact interface layer.

In a device embodiment, the gettering metal may be, but is not limited to one of Ti, Zr and Hf. The dopant may be, but is not limited to Cu. The contact interface material may include Te, for example, the contact interface material may be, but is not limited to ZnTe.

Alternative embodiments include a back contact for a CdS/CdTe PV device comprising a contact interface layer comprising a contact interface material, a dopant and a gettering metal; and an outer metallization layer in electrical contact with the contact interface layer as described above.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "component" encompass both components comprising one unit and components that comprise more than one unit unless specifically stated otherwise.

Figure 1:
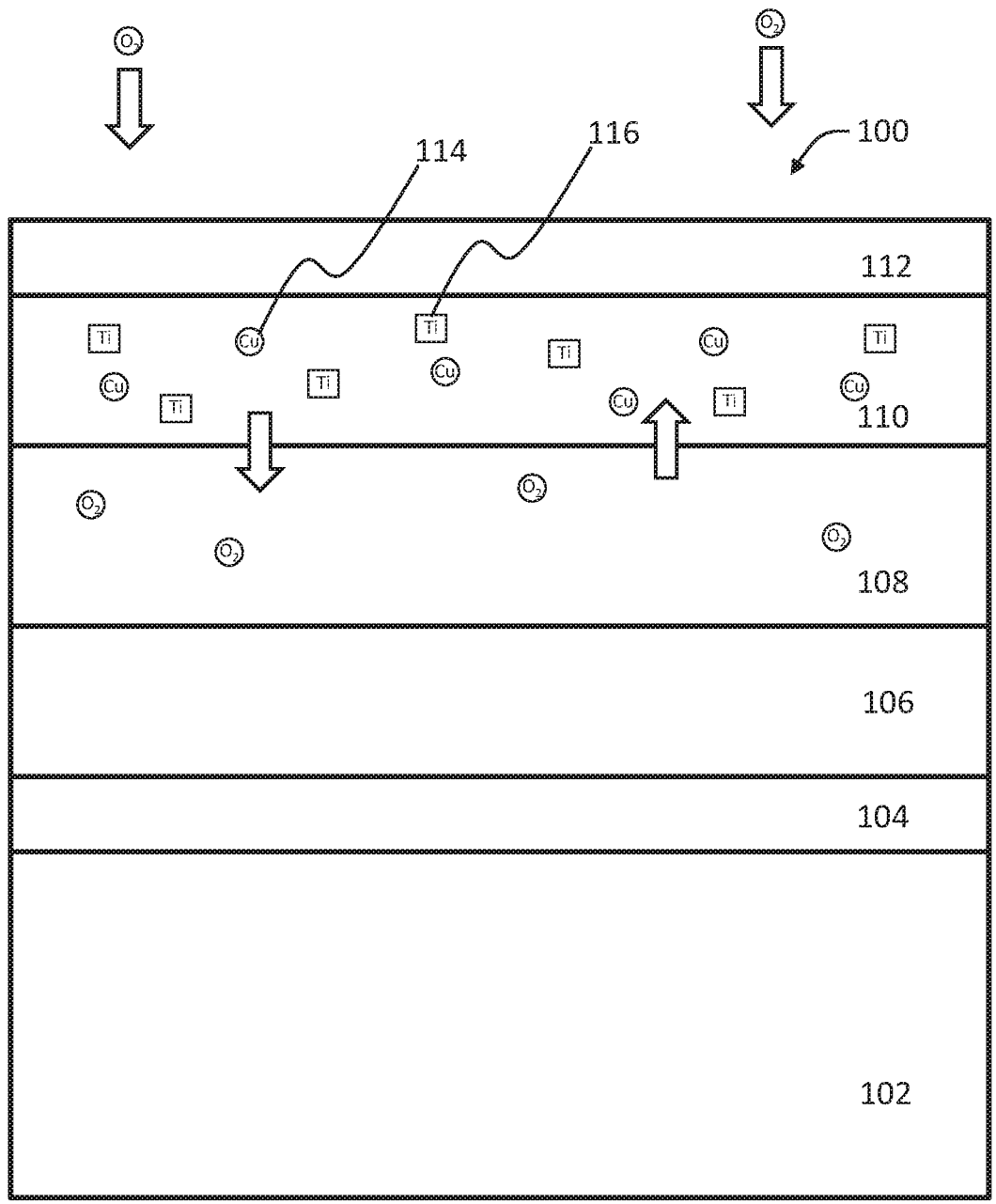
FIG. 1 is a schematic diagram of a CdS/CdTe device as disclosed herein, immediately after deposition of back contact layers, before Cu diffusion occurs.

Certain embodiments disclosed herein are methods useful for the manufacture of high efficiency CdS/CdTe PV devices. Other embodiments include specific CdS/CdTe PV devices and device layers. As generally shown in FIG. 1, a CdS/CdTe PV device 100 includes a superstrate 102 which is usually a glass superstrate. The device also includes one or more TCO layers 104 in physical contact with the superstrate; an n-type CdS layer 106 in electrical contact with at least one TCO layer 104, and a CdTe layer 108 in electrical contact with the CdS layer 106. A superstrate configured CdS/CdTe device 100 also includes a back ohmic contact in electrical contact with the CdTe layer 108. In one embodiment, a back contact includes at least a contact interface layer 110 and an outer metallization layer 112 although fewer or more contact layers may be provided. The contact interface layer 110 provides for suitable adhesion between the CdTe layer and any metal outer contact. More importantly, with respect to the present disclosure, a contact interface layer 110 can be deposited from materials and according to techniques designed to significantly impact the operational properties of a device. The methods and structures disclosed herein may also be implemented to create or enhance the back contact of a CdS/CdTe PV device prepared in a substrate configuration.

In particular, certain back contact formation processes will significantly alter the electrical properties of the underlying CdTe layer, thereby significantly affecting device functionality. An as-deposited CdTe layer is usually of insufficient electrical quality to support effective junction operation. Certain back contacting processes can be used to diffuse one or more dopant species, for example Cu, into the CdTe layer. Dopants diffused in this manner can improve the electrical quality of an uncontacted CdTe layer. For example, successful Cu diffusion into the CdTe layer causes the CdTe layer to become sufficiently p-type to establish a strong field in the CdTe regions near to the CdS layer.

The contact interface layer 110 may be composed of a compound with a group VIA material as the anion, for example O, S, Se, and Te. As noted above the contact interface layer overlies the CdTe layer and the "common anion rule" suggests that two discrete layers with common anions are preferred if the interface benefits from nearly continuous valance bands. Valance-band continuity is an important attribute for low-resistance hole conduction, especially when it is difficult for the semiconductor absorber material to be made highly p-type, as is the case with CdTe. Some specific examples of suitable contact interface layers include: ZnTe, HgTe, $Cu_xTe$ (x being a subscript between 0 and 2), PbTe, SnTe, $MoTe_2$, $CrO_2$, $WO_2$, CdS, ZnS, PbS, $Mo_xO_y$ (x and y between 1 and 3), and CdO. As used herein, any of the foregoing or similar materials that are either doped or undoped, which can be used to form a contact interface layer are referred to as "contact interface materials." One back contact structure which has been shown to be advantageous includes a ZnTe contact interface layer doped with copper, referred to herein as a ZnTe:Cu contact interface layer.

Any processing step or natural occurrence which prevents, limits, or alters the reproducible diffusion of Cu into the CdTe layer can be detrimental to optimizing the final device efficiency. For example, the oxidation of Cu to form CuO during or after deposition of a contact interface layer prohibits diffusion of the Cu as desired. Oxidation of Cu may result within the pre-deposited source, during deposition, or during one or more post-deposition processes.

Applicants have determined that the use of Ti, deposited as the outer metallization layer over a ZnTe:Cu contact interface layer for polycrystalline CdTe devices provides several performance advantages. Initially it may be noted that Ti is more adherent to the ZnTe:Cu contact interface layer than some other refractory metals, such as Ni. Second, Ti can be chemically etched selectively from the ZnTe:Cu layer. In addition, devices having Ti metallization yield consistently higher voltages (about 100 mV+ higher) when compared to substantially identical devices using Ni or another metal in as the outer contact.

Applicants have determined that one, or possibly the primary cause of increased device voltage due to the use of Ti metallization is the effectiveness of Ti as an oxygen getter. As used herein, a "getter" is any substance, typically a metal, which readily combines with oxygen and serves to semi-permanently bind oxygen during any stage of device fabrication or use to prevent the oxygen from undesirably oxidizing another element or compound. With respect to the CdS/CdTe device having Ti metallization described above, Applicant believes that one source of the oxygen which forms $TiO_2$ at or near the Ti/ZnTe:Cu interface is oxygen diffusing out of the ZnTe:Cu layer. Thus, the use of Ti metallization getters oxygen from the ZnTe:Cu layer causing there to be less oxygen remaining within the ZnTe:Cu layer to form CuO. Accordingly, Cu diffusion into the CdTe layer is more reproducible, and the gettering ability of Ti directly enhances the electrical properties of the device noted above.

Ti is an effective oxygen getter in part because it can oxidize rapidly to form $TiO_2$. Ti is an effective getter even though CuO has a relatively strong bond between the Cu and oxygen. The enthalpy of the CuO bond is approximately −38 to −40 kcal/mole, which demonstrates why Cu bound into CuO is unavailable to the CdTe layer. The enthalpy of a CuTe bond is only about −6 kcal/mole. However, the CuO bond it is not as strong as a $TiO_2$ bond at −226 kcal/mol. Typical ZnTe:Cu contact deposition processes provide sufficient thermal energy to enable oxygen diffusion, as well as the disassociation of some of the CuO bonds. There is not, however sufficient thermal energy available to disassociate any $TiO_2$ bonds. Therefore, oxygen that diffuses to a Ti surface will be permanently gettered at the process and operating temperatures of the CdS/CdTe device.

The foregoing observations explain why CdS/CdTe devices having a Ti metallization layer tend to produce higher voltages. In summary, one important role of the Ti (or other refractory metal) layer is to getter oxygen from the ZnTe:Cu contact interface layer and possibly also to getter oxygen from the CdTe layer. This insight suggests that device performance could be further enhanced with alternative contacts specifically designed to getter oxygen more effectively.

In a CdS/CdTe device having a Ti metallization layer as described above, the benefits of the Ti layer as a gettering surface can only be realized if oxygen can diffuse all the way through the contact interface to the Ti layer. Also, once the Ti surface is oxidized, the rate at which the Ti layer getters additional oxygen is reduced. Furthermore, a reasonable degree of oxygen diffusion is possible during the production of research devices were the duration of high temperature contacting processes is relatively long (typically 1-4 hours). On the contrary, relatively long-distance oxygen diffusion during production becomes much less likely in a rapid-cycle commercial process which may take 1 minute or less. In a rapid commercial process sequence, any Ti getter surface would be much more effective if it were located closer to the detrimental oxygen, or along a likely oxygen diffusion path.

Certain embodiments disclosed herein feature an alternative contact design that better meets the needs of a commercial device. The disclosed contacts have Ti or another refractory metal distributed throughout the contact interface layer, which may be, but is not limited to a ZnTe:Cu contact interface layer. The methods described herein can be implemented with any suitable getter metal compound, dopant and contact-interface material. In much of the comprehensive disclosure below, a certain metal (Ti), a specific contact interface material (ZnTe) and a specific dopant (Cu) are discussed in significant detail. These particular material choices are discussed in detail to conveniently illustrate the underlying principles disclosed herein. Therefore, the discussion of Ti, ZnTe and Cu herein should not be construed as limiting the embodiments disclosed to any particular getter metal, contact interface material or dopant.

A contact having Ti or another refractory metal distributed throughout a contact interface or other layer could possibly be fabricated by mixing Ti granules into the powder used to make the pressed-powder sputtering target used to deposit the contact interface layer. Unfortunately, this fabrication method presents a problem for commercial implementation. It is difficult to mix pure Ti granules into the ZnTe+Cu powder used to form an evaporation/sublimation source or sputtering target. Unless the target powder preparation was performed under reducing or ultra-high vacuum conditions, the Ti granules would oxidize quickly and form stable $TiO_2$ granules during the mixing process.

Also, because $TiO_2$ has exceptionally high negative enthalpy as noted above, a typical sputtering process will not fractionate a significant portion of the $TiO_2$ into elemental Ti and oxygen. Furthermore, any elemental Ti that was fractionated would quickly reform $TiO_2$ with the oxygen just released, destroying the ability of the inclusion to getter additional oxygen. Another problem anticipated with a method based upon mixing elemental Ti into the target powder is the potential for rapid oxidation of Ti during any stage of the target preparation process which could be an extremely hazardous situation.

Figure 2:
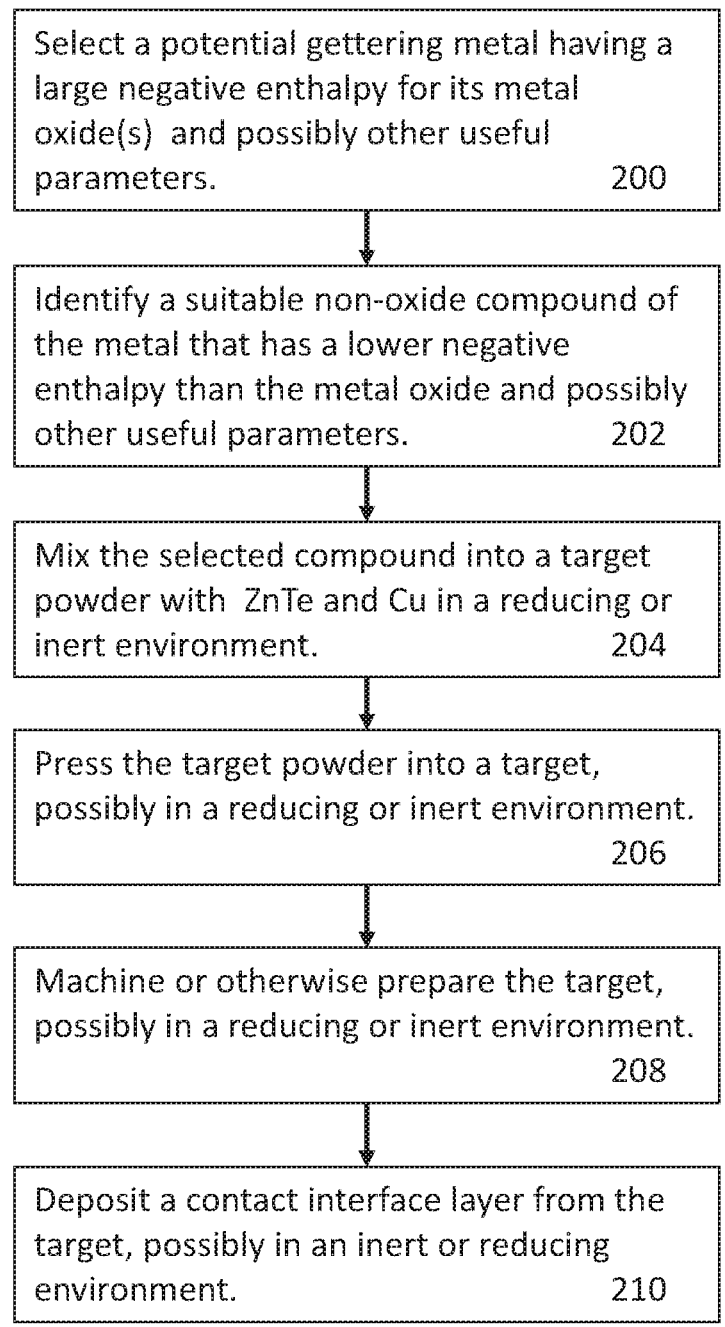
FIG. 2 is a flowchart illustration of a disclosed method.

Accordingly, certain embodiments disclosed herein incorporate Ti or other refractory metal atoms into a sputtered film without adding elemental Ti to a sputter target. In particular, as illustrated in FIG. 2, a suitable target may be prepared by first selecting a potential gettering metal having a large negative enthalpy for its metal oxide(s) and possibly other useful parameters (step 200). Next, a suitable non-oxide compound of the metal may be identified which has a lower negative enthalpy than the metal oxide (Step 202). Ideally, the negative enthalpy of the selected non-oxide metal compound will be low enough that the metal and the additional element(s) will substantially fractionate at the energies and/or temperatures required to deposit the contact layers. Once a suitable metal compound is selected, an appropriate amount of the selected compound may be mixed into a target powder along with a semiconductor and dopant, for example, ZnTe and Cu (step 204). The target powder may then be pressed into a deposition target by any suitable process (step 206). Similarly, the target may be machined or otherwise prepared for use (step 208). The target may then be used to deposit a contact interface layer or other contact layer on the CdTe layer of a CdS/CdTe device (step 210). In certain instances one or more of the mixing, pressing, machining or deposition steps (steps 204-210) may be wholly or partially performed in an inert or reducing atmosphere to avoid oxygen contamination.

If the non-oxide compound of the gettering metal is selected to have a suitably low negative bond enthalpy, the compound will fractionate during deposition resulting in substantially elemental atoms of the gettering metal deposited within and distributed throughout the deposited contact layers. As schematically illustrated in FIG. 1, a CdS/CdTe device 100 might thus be produced having a contact interface layer 110 with a necessary dopant such as Cu (illustrated as Cu circles 114) and a gettering metal such as Ti (illustrated as Ti squares 116) distributed throughout the contact interface layer in a quantity controlled by the target preparation steps.

Figure 3:
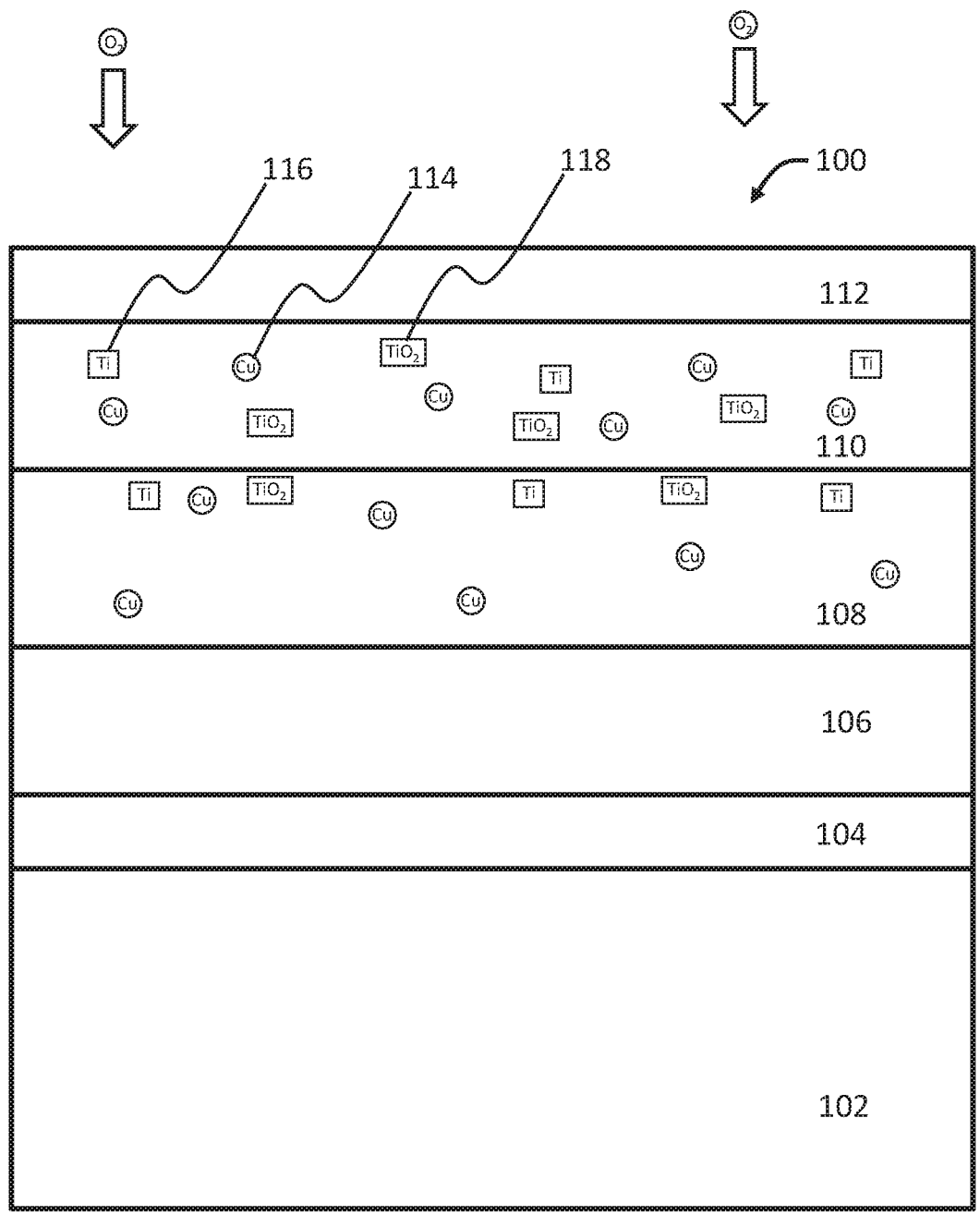
FIG. 3 is a schematic diagram of the CdS/CdTe device of FIG. 1, after Cu diffusion occurs.

During and after deposition, the deposited atoms of Cu, the gettering metal and oxygen will diffuse between the contact interface layer 110, the CdTe layer 112 and possibly other layers. Oxygen can also diffuse into the device from any processing atmosphere containing oxygen or from the air during use or storage. These highly generalized diffusion pathways are represented on FIG. 1 as arrows. After some diffusion has occurred, the device becomes as schematically illustrated in FIG. 3. In particular, a significant portion of the oxygen present in the contact interface layer 110 and potentially the CdTe layer 108 becomes permanently bound to the gettering metal (as shown by $TiO_2$ rectangles 118) on FIG. 3. The oxygen can be bound in the contact interface layer 110 or near the contact interface layer in the CdTe layer 108 since a small amount of elemental Ti may diffuse into the CdTe layer. Because enough of the oxygen within the device has been effectively gettered, the Cu 114 is free to diffuse from the contact interface layer 110 to the CdTe layer 108 as is required for optimum device performance. In addition, additional oxygen diffusing into the device during storage or use can be gettered by surplus gettering metal. Thus, the back contact metallization 112 can be implemented with a metal which is not an effective getter, if desired.

As noted above, a suitable Ti compound for the formation of a deposition target as described in FIG. 2, steps 204-208 should have the following qualities: a) higher stability to oxidation than pure Ti; b) does not contain oxygen; and c) does not have a high negative enthalpy. These criteria should provide for the compound to be ground or otherwise processed to the proper size for target pressing without significant oxidization. The foregoing criteria also allow fractionation of the selected compound into atomic species during sputtering, thereby causing Ti to be incorporated into the contact layers as a getter. For example, the compound $TiTe_2$ has a heat of formation of about −50 kcal/mole and therefore meets the criteria outlined above.

One potential concern with adding $TiTe_2$ granules to a ZnTe+Cu target mixture is that the target powder mixture would become overly enriched in Te. Fortunately, Te enrichment may be of benefit for several reasons. Material defect calculations suggest that CdTe and ZnTe layers that can be deficient in Te, and this deficiency can cause the formation of Te vacancies within the CdTe material, and these vacancies can act as donors and/or mid-gap recombination sites. These donors and/or recombination sites are undesirable in CdTe used for PV applications because they are known to limit the performance of the device. By adding a small amount of extra Te in the form of $TiTe_2$, the target not only produces a film with an appropriate amount of Ti getter, but also yields a ZnTe:Cu film that is enriched in Te or at least less likely to be Te deficient. Te that diffuses from the ZnTe:Cu contact interface layer into the CdTe layer could be optimized to improve the CdTe quality if Te vacancies were present. To preserve the foregoing benefits, it is important that the deposition temperature be selected to control evaporation of the low melting-point/high vapor pressure Te as the sputtering process heats the various surfaces involved.

The most important plasma, surface, and bulk reactions that are expected to progress during sputtering of a $TiTe_2$ containing ZnTe:Cu target are as follows:

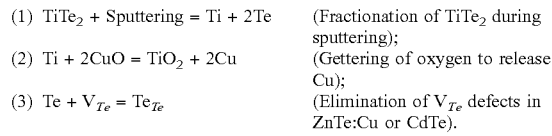

(1) $TiTe_2$ + Sputtering = Ti + 2Te (Fractionation of $TiTe_2$ during sputtering);
(2) Ti + 2CuO = $TiO_2$ + 2Cu (Gettering of oxygen to release Cu);
(3) Te + $V_{Te}$ = $Te_{Te}$ (Elimination of $V_{Te}$ defects in ZnTe:Cu or CdTe).

Although the above description has been presented using Ti as the getter species, the embodiments disclosed herein will work equally well with other Group IVB refractory metals such as Zr and Hf. Further, in some applications, it may be beneficial to choose gettering addition(s) that enhance other electrical, structural, or optical material properties of the device. In these cases, the effectiveness of the additional element(s) as a getter may be a balance between the enthalpy of the resulting metal oxide, and other required properties. It is expected that metals such as Mg, Ca, Sr, Ba, Sc, Y, La, Ac, V, Nb, Ta, Cr, Mo, and W would be useful in certain applications. For example, in the case of ZnTe:Cu as a contact interface, Cu acts as a Group IB, p-type dopant by substituting onto a Cd lattice site. In this application, a gettering addition from Group 1A of the periodic table may provide not only oxygen gettering function, but also provide p-type doping similar to Cu. The choice of an appropriate getter metal compound added to a target in the manner of $TiTe_2$ can be guided, in part, by the ability to find compounds that could be added to a sputtering target which would be expected to sputter atomically. For example, a compound such as $ZrO_2$ that will tend to sputter with a significant fraction of Zr—O dimers or trimers (two or more atoms rather than one atom) may be unsuitable.

In addition, the above description has been presented using ZnTe as the contact interface material. The foregoing principles can be applied to any suitable contact interface material, including but not limited to ZnTe, HgTe, $Cu_xTe$ (x being a subscript between 0 and 2), PbTe, SnTe, $MoTe_2$, $CrO_2$, $WO_2$, CdS, ZnS, PbS, $Mo_xO_y$ (x and y between 1 and 3), and CdO. These alternative interface materials may also be doped to attain necessary electrical parameters for the intended contact application.

The description of the disclosed embodiments has been presented for purposes of illustration and description, but is not intended to be exhaustive or limiting of the claims to any particular form disclosed. The scope of the present disclosure is limited only by the scope of the following claims. Many modifications and variations will be apparent to those of ordinary skill in the art. The embodiments described and shown in the figures were chosen and described in order to best explain the principles of the various embodiments, the practical application, and to enable others of ordinary skill in the art to understand the various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope of the disclosure.

Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

What is claimed is:
1. A method comprising:
forming a sputtering target comprising a contact interface material, a dopant, and a non-oxide compound of a gettering metal;
depositing the sputtering target on to a CdTe device layer to form a contact interface layer comprising the contact interface material, the dopant and the non-oxide compound of the gettering material; and
depositing an outer metallization layer comprising the gettering metal to the contact interface layer; wherein:
the dopant diffuses into the CdTe device layer causing the CdTe device layer to become p-type,
the gettering metal diffuses into the contact interface layer from the outer metallization layer, and
the non-oxide compound of the gettering metal diffuses into the CdTe device layer.

2. The method of claim 1 wherein the non-oxide compound of the gettering metal exhibits a smaller negative enthalpy than a metal oxide of the gettering metal.

3. The method of claim 1 wherein the gettering metal is Ti, Zr, or Hf.

4. The method of claim 2 wherein the non-oxide compound of the gettering metal is $TiTe_2$.

5. The method of claim 1 the contact interface material is ZnTe.

6. The method of claim 1, wherein
the contact interface material, the dopant, and the non-oxide compound of the getting metal were pressed to form the sputtering target in an inert or reducing atmosphere; and
machining the sputtering target in an inert or reducing atmosphere.

7. The method of claim 1 further comprising depositing the contact interface layer in an inert or reducing atmosphere.

8. The method of claim 1 wherein the sputtering target comprises ZnTe, Cu, and the gettering metal.

9. The method of claim 8 wherein the gettering metal is Ti.

10. The method of claim 1, wherein the dopant is a group IA species or a group VA species.

11. The method of claim 10, wherein the dopant is Cu.

* * * * *